Figure 1:
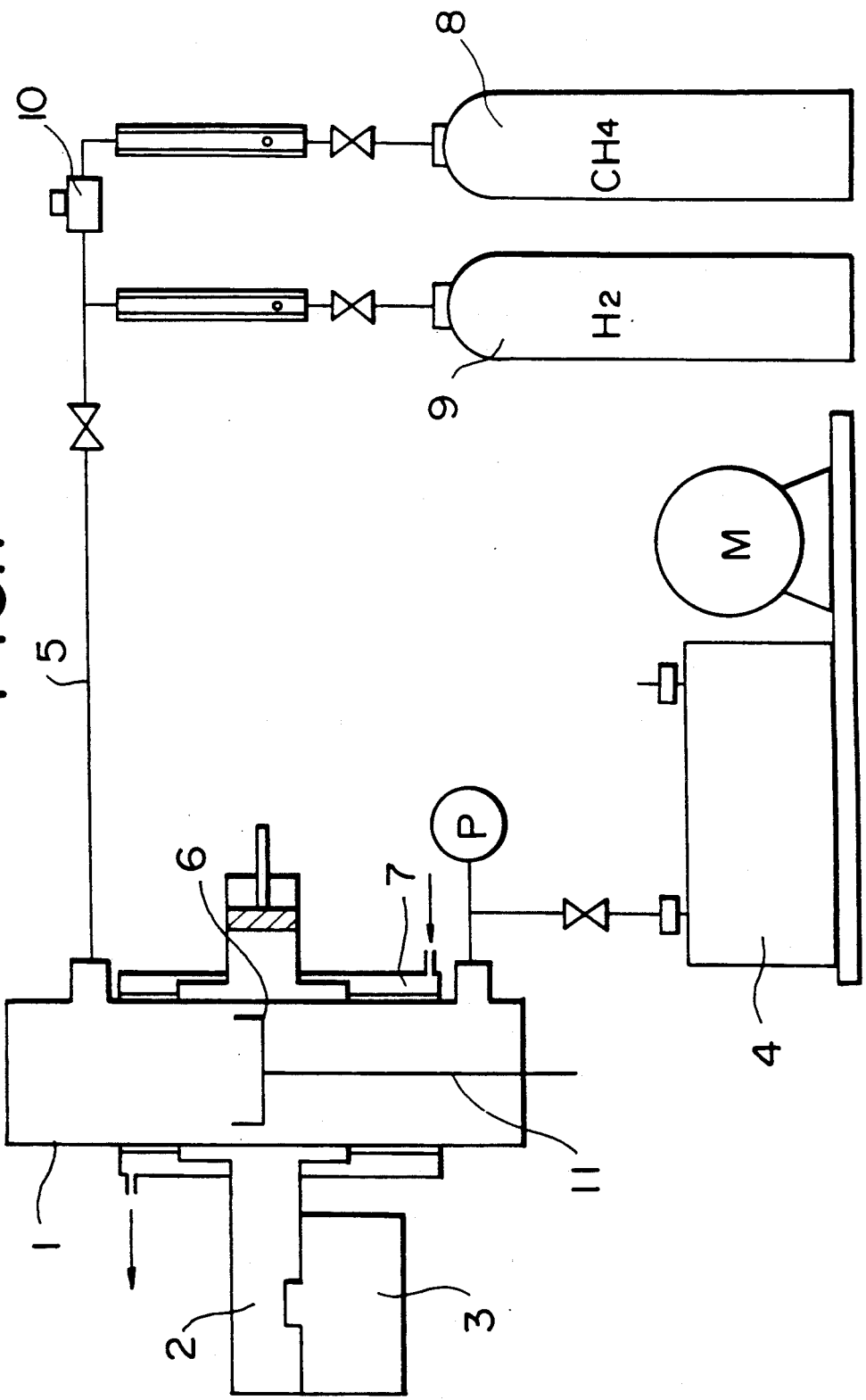

United States Patent [19]

Chen et al.

[11] Patent Number: 5,061,292
[45] Date of Patent: Oct. 29, 1991

[54] DIAMOND ABRASIVE AND METHOD FOR PRODUCING THE SAME

[75] Inventors: Chia-Fu Chen, Hatano; Ensei Ko, 835-2, Nishi Koiso, Oiso-machi, Naka-gun, Kanagawa-ken; Hiroshi Ishizuka, Tokyo; Satoru Hosomi, Hiratsuka, all of Japan

[73] Assignees: The Ishizuka Research Institute, Ltd., Hiratsuka; Ensei Ko, Oiso, both of Japan

[21] Appl. No.: 379,219

[22] Filed: Jul. 13, 1989

[30] Foreign Application Priority Data

Jul. 29, 1988 [JP] Japan .................. 63-190094

[51] Int. Cl.⁵ .................. B24D 3/00
[52] U.S. Cl. .................. 51/293; 51/295; 51/307
[58] Field of Search .................. 51/293, 295, 307

[56] References Cited

U.S. PATENT DOCUMENTS

| | | | |
|---|---|---|---|
| 4,063,907 | 12/1977 | Lee et al. | 51/295 |
| 4,089,933 | 5/1978 | Vereschagin et al. | 51/307 |
| 4,104,441 | 8/1978 | Fedoseev et al. | 51/307 |
| 4,124,690 | 11/1978 | Strong et al. | 51/307 |
| 4,196,181 | 4/1980 | Vereschagin et al. | 51/293 |
| 4,220,455 | 9/1980 | St. Pierre et al. | 51/295 |
| 4,610,698 | 9/1986 | Eaton et al. | 51/293 |
| 4,832,708 | 5/1989 | Csillag | 51/307 |

Primary Examiner—William R. Dixon, Jr.
Assistant Examiner—Willie J. Thompson
Attorney, Agent, or Firm—Larson and Taylor

[57] ABSTRACT

Diamond abrasive comprising a mass of idiomorphic crystal grits which each have an irregular shaped core of diamond formed under pressure where diamond is thermodynamically favored phase, and a growth layer of diamond and/or diamond-like carbon formed over said core by chemical vapor deposition.

11 Claims, 2 Drawing Sheets

DIAMOND ABRASIVE AND METHOD FOR PRODUCING THE SAME The present invention relates to a production of abrasive of well shaped fine diamond crystal grits which exhibit, particularly, an average size of or less than 60 microns, for the application to precision machinings.

There is an ever increasing demand for fine diamond abrasive of, especially, sizes less than 60 microns, as the precision machining is developed steadily and widely these days. Some possibilities have been proposed and realized for the production of such well crystallized fine diamond grits: they can be formed, under high pressure where diamond is thermodynamically stable, by maximizing nucleation and thus controlling the growth which follows. Or, more commonly, they are made of either irregular shaped tailings of natural or synthetic diamond which come from sorting processes, or such coarse crystals otherwise useless, by crushing and subsequently shape and size sorting to give a specific size distribution. The grits are used as shaped in a mold or as a loose abrasive.

Although much of the so prepared diamond grits retains good mechanical properties, the performance one can achieve is often far lower than one could expect because of the irregular shapes and low consistency in edge generation the cleavage results, as well as cracks formed during the crushing process. They also suffer often premature popout of grits from the bond matrix due to the cracking under load applied during a work. Thus there has been much left for improvement of diamond as abrasive for precision machining applications.

Therefore one of the principal objects of the present invention is to provide a fine grit, particularly not exceeding 60 microns, diamond abrasive which exhibits consistency in mechanical properties, with such cracks essentially eliminated from the grit surfaces.

Another object is to provide an efficient method of the production of such abrasive.

According to the invention there is provided a diamond abrasive comprising a mass of idiomorphic crystal grits which each have an irregular shaped core of diamond formed under pressure where diamond is thermodynamically favored phase, and a growth layer of diamond and/or diamond-like carbon formed over said core by chemical vapor deposition. Also provided is a method of producing diamond abrasive, comprising: placing as seeds irregular shaped diamond particles from a high pressure process in a controlled gas mixture comprising hydrogen and carbonaceous substance, exciting the gas mixture to be in plasma state exposing said particles to the plasma thus causing growth of the particles, regulating the growth rate to a level close to the kinetic equilibrium thus imparting idiomorphic shapes, and recovering the grown diamond as abrasive grits.

In the invention various types of fine diamond particles can be used as seeds for diamond or diamond like carbon to grow thereon. The invention in itself has been basically directed and thus most advantageously applicable to enhance the properties of irregular shaped fragments from crushing processes. The sizes of seeds or core particles should be of or less than 20 microns. The size can be determined with magnified photographs as specified in Japanese Industrial Standard JIS R6002 "Testing methods for abrasive grain size". Such particles should preferably be size sorted to exhibit a close distribution, so as-grown diamond particles may be used in precision machinings without further conducting a time consuming sorting process. A certain mass of seeds are placed in the chamber of an appropriate apparatus for chemical vapor deposition (CVD), where a mixed gas comprising hydrogen and some carbon-containing gas is introduced and excited by microwave induction, for example, so that the particles are subjected to a plasma.

As a carbon-containing gas these are available: methane and carbon monooxide, as well as some alcohols, acetones, and ketones. A few of the most effective gas combinations include in particular carbon monooxide and hydrogen, and methane and hydrogen, each with or without addition of oxygen or carbon dioxide. It has been found advantageous that the mixed gas comprise oxygen or oxygen-generating gas for their effect on crystallinity improvement, while hydrogen may apparently contribute to the activation of the plasma.

Thermoelectron irradiation, glow or arc discharge may be used for gas excitation in the place of microwave induction.

The growth process by CVD is conducted at gas compositions where the secondary growth does not occur significantly on the diamond surface. Such conditions can be provided, for example, by using low concentrations of carbon-containing gas or, in cases where there is oxygen content, which may be present in either free or combined state, rather high oxygen to carbon ratios. The growth proceeds preferentially at cracks, recess, and other defective sites where surface energy is relatively high, so diamond particles which result have no or few surface defects as well as high symmetry with the minor to major axis ratio close to 1 as measured according to the above mentioned JIS. The closer to one the ratio, the higher the symmetry and thus the strength. Such good surface structure and improved aspect assure the diamond of improved mechanical properties. In particular ratios less than 1.3 are favorable as giving high strength and good abrasive performance.

When growth is controlled to less than twice the seed size by controlling the parameters to proceed the process at rates close to the kinetic equilibrium and especially, at rates less than 5 microns per hour, the optimal crystalline feature of idiomorphism can be fully achieved. Further growth is unfavorable for the prolonged duration as well as too much consumption of material and energy.

Figure 2:
Figure 3:
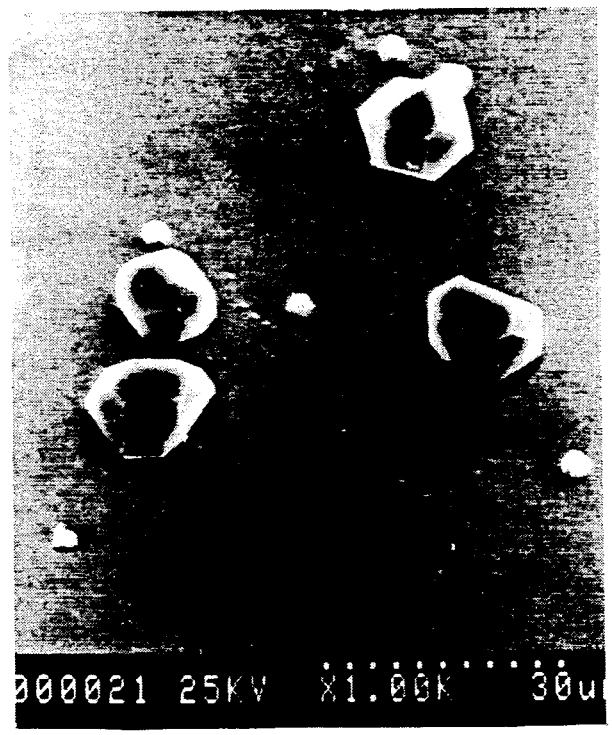

The invention will be described in reference with the attached drawing, in which:

FIG. 1 shows a diagrammatic illustration of a CVD arrangement with which the method of the invention can be conducted; and FIGS. 2 and 3 show electron micrographs of diamond seeds, respectively, before- and after the process of the invention.

In the figures the vertical chamber 1 consists of a quartz tube, closed at each end hermetically with a threaded removable cap. The tube is coupled with a magnetron 3 by means of a waveguide 2. It is also connected at the bottom to a degassing line with a vacuum pump 4 and at the top to a gas supply line 5. A quartz stick 11 extends through the bottom axially into the chamber 1, which supports at the top end a seed carrier 6. The stick may be slidable axially for level adjustment so as to hold seeds in the region where power is concentrated, and also convenience for seed mounting and recovery of grown diamond. As necessary a water jacket 7 can be provided around the tube. Methane and hydrogen gases are supplied from their respective sources 8, 9 via a mass flow controller 10, when necessary.

EXAMPLE 1

The arrangement as illustrated in FIG. 1 was employed. A mass of 10 micron diamond particles was scattered on a carrier of circular quartz 15 mm across, and then raised to the position, in the quartz tube 48 mm across at the center. The seed particles, from a static high pressure process, had non-idiomorphic irregular flaky shapes as shown in FIG. 2. While passing at an overall rate of 170 cc per min. a mixed gas of 100 parts of $H_2$ and one part of methane, on volume basis, a 2.45 GHz microwave was transmitted from the magnetron operating at 220 W to the chamber to heat the carrier to 900° C. Pressure was maintained at about 2.5 KPa by controlled degassing. At the end of a 2 hour process, diamond particles with an average size of 15 mm were recovered, as shown in FIG. 3. An ID wheel was prepared with the diamond electrolytically, and successfully used in an abrasive work.

EXAMPLE 2

The cycle of the above example was repeated with the same arrangement and similar diamond seeds.

A mixed gas of 1.5 part of $O_2$, one part of methane and 100 parts of $H_2$ was used instead of the binary composition. The gas was introduced at an overall rate of 100 cc per min. Under pressure at about 2.5 KPa the process was continued for 3 hours and finally produced diamond particles whose average size measured 18 microns.

Although the above examples use only the arrangement where the diamond seeds rest statically on a carrier, it may be obvious that the invention may be also practised in a fluidized bed process where seeds are grown in suspension in a plasma.

We claim:

1. Abrasive grits comprising a mass of idiomorphic diamond crystals which each have an irregular shaped core of diamond formed under a pressure at which diamond is the thermodynamicaly favored phase of carbon, and a growth layer of diamond-like carbon, which has at least in part a diamond structure, formed over said core by chemical vapor deposition.

2. The diamond abrasive as claimed in claim 1, in which said grits, as measured in average, exhibit an overall size not greater than twice the core.

3. The diamond abrasive as claimed in claim 2, in which said grits are not greater than 60 microns.

4. The diamond abrasive as claimed in claim 1, in which said grits exhibit a major to minor axial ratio not greater than 1.3 in average when taken perpendicular to the major axis.

5. A method of producing diamond abrasive, comprising: placing as seeds irregular shaped diamond particles from a high pressure process in a controlled gas mixture comprising hydrogen and carbonaceous substance, exciting the gas mixture to be in plasma state, exposing said particles to the plasma thus causing growth of the particles, regulating the growth rate to a level close to the kinetic equilibrium thus imparting idiomorphic shapes, and recovering the grown diamond as abrasive grits.

6. The method as claimed in claim 5, in which said growth rate is a radial increase on the order of a few microns per hour.

7. The method as claimed in claim 6, in which said growth rate is a radial increase not greater than 5 microns per hour.

8. The method as claimed in claim 6, in which said growth rate is a radial increase not greater than 3 microns per hour.

9. The method as claimed in claim 5, in which said seeds exhibit an average size of 20 microns.

10. The method as claimed in claim 5, in which said grits are recovered before an average size exceeds twice the core size.

11. Abrasive grits made according to the process of claim 5.

* * * * *